United States Patent [19]
En

[11] Patent Number: 5,963,412
[45] Date of Patent: Oct. 5, 1999

[54] PROCESS INDUCED CHARGING DAMAGE CONTROL DEVICE

[75] Inventor: William George En, Sunnyvale, Calif.

[73] Assignee: Advanced Micro Devices, Inc., Sunnyvale, Calif.

[21] Appl. No.: 08/969,580

[22] Filed: Nov. 13, 1997

[51] Int. Cl.⁶ .................................................. H02H 3/22
[52] U.S. Cl. ........................... 361/111; 361/56; 257/356
[58] Field of Search ............................... 361/56, 91, 111; 257/355–362

[56] References Cited

U.S. PATENT DOCUMENTS 5,650,651 7/1997 Bui .......................................... 257/355

OTHER PUBLICATIONS

*International Electron Devices Meeting*, Sponsored by Electron Devices Society of IEEE, Washington, DC, Dec. 508, 1993, pp. 18.3.0–18.3.4.

*Japanese Journal of Applied Physics*, Oct., 1994, vol. 33 No. 10.

*1996 1ˢᵗ International Symposium on Plasma Process–Induced Damage*, Kin P. Cheung, Moritaka Nakamura and Calvin T. Gabriel, Editors, Santa Clara, California May 13–14, 1996.

*Primary Examiner*—Michael J. Sherry
*Attorney, Agent, or Firm*—Renner, Otto, Boisselle & Sklar, P.L.L.

[57] ABSTRACT

A plasma charging damage protection structure (40, 104) includes a first conduction path (90) for conducting positive plasma charging away from a device needing protection (44) and a second conduction path (94) for conducting negative plasma charging away from the device needing protection (44). In addition, a method (200) of preventing plasma induced charging damage includes the forming of plasma charging during semiconductor processing (202). The method also includes conducting the plasma charging through a first conduction path if the plasma charging is positive (210) and conducting the plasma charging through a second conduction path if the plasma charging is negative (214).

8 Claims, 4 Drawing Sheets

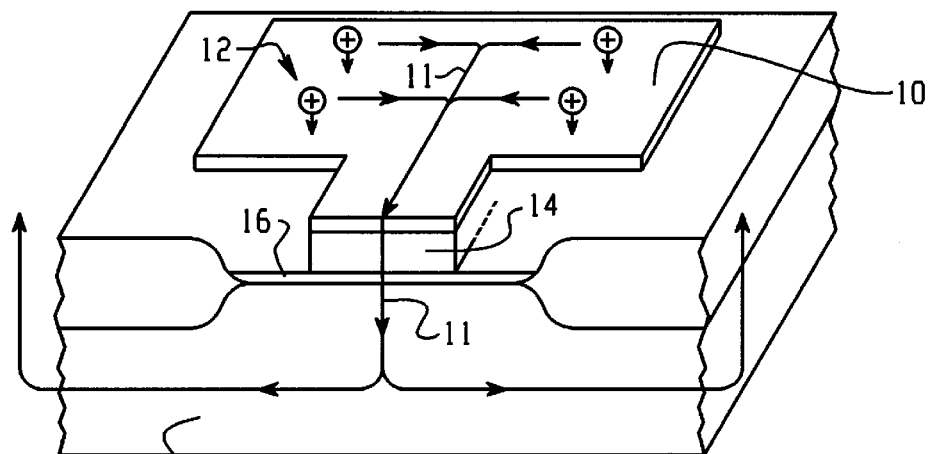
Fig. 1
(PRIOR ART)
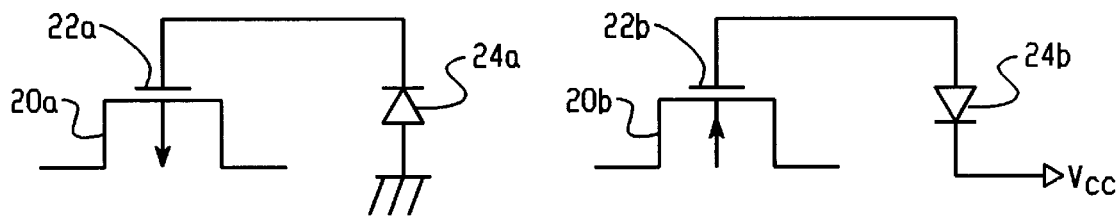
Fig. 2a
(PRIOR ART)
Fig. 2b
(PRIOR ART)
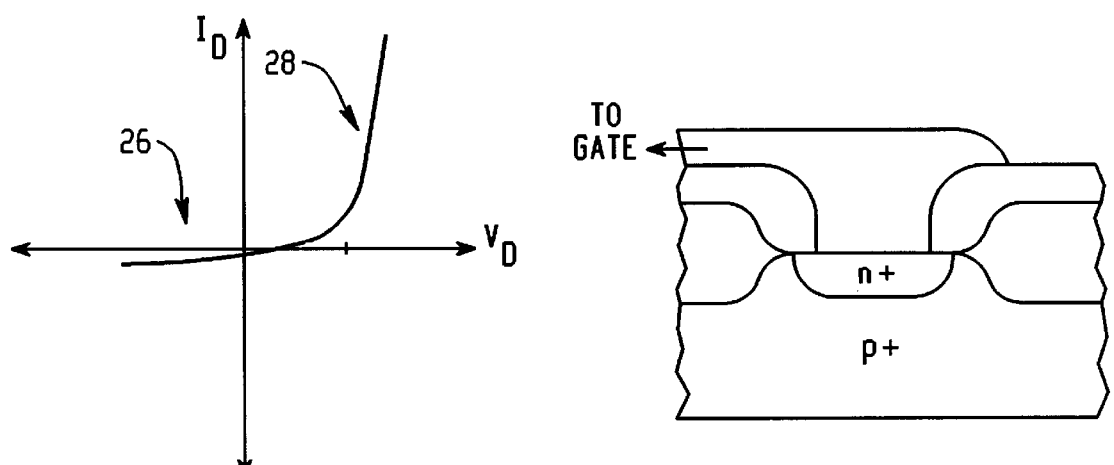
Fig. 2c
(PRIOR ART)
Fig. 2d
(PRIOR ART)

PROCESS INDUCED CHARGING DAMAGE CONTROL DEVICE

FIELD OF THE INVENTION

The present invention is generally directed toward integrated circuits and is more particularly related to a device and method for reducing positive and negative plasma charging damage during semiconductor processing.

BACKGROUND OF THE INVENTION

Plasma processing constitutes a wide range of semiconductor processing steps. For example, plasma enhanced chemical vapor deposition (PECVD) utilizes an RF induced glow discharge (or plasma) to transfer energy into reactant gases to allow the substrate (upon which a film will be formed) to remain at a lower temperature than other CVD processes. The lower substrate temperature provides a method for depositing films on substrates that do not have the thermal stability to accept coating by other methods (such as, for example, silicon nitride and silicon dioxide over metals). In addition, the plasma enhances the deposition rate of films over solely thermal CVD processes and can produce films of unique compositions and properties.

In addition to CVD, plasma processing is utilized in dry etching processes such as, for example, plasma etching and reactive ion etching (RIE). When using a plasma in an etch process, a glow discharge is utilized to produce a chemically reactive species (atoms, radicals and ions) from a relatively inert molecular gas. The reactive species then react chemically with the material to be etched, thereby forming a volatile by-product which is desorbed from the surface and diffused into the bulk of the gas. The use of plasma in etching is advantageous because high selectivities with controlled anisotropy may be obtained.

Plasma processing has therefore become an integral part of integrated circuit fabrication because it provides advantages in terms of directionality, low temperature and process convenience. Plasma processing, however, also introduces a potential for increased damage due to surface charging of floating gates in MOS (metal oxide semiconductor) devices. This surface charging during plasma processing is often referred to as plasma charging damage. As the gate oxide of MOS devices continue to decrease in thickness to improve device performance, plasma charging is becoming a large concern since it can degrade the electrical properties of the gate oxide. Such gate oxide degradation may impact, for example, the fixed oxide charge density, the interface state density, the flat band voltage, the leakage current, the device threshold voltage and breakdown related parameters.

The mechanism by which plasma charging damages the gate oxide is illustrated in prior art FIG. 1 and is discussed in detail in an article entitled *Plasma Charging Damage: An Overview*, by J. P. McVittie, 1996, First International Symposium on Plasma-Induced Damage, pp. 7–10. An imbalance in the number of positive ions and electrons on a wafer surface 10 result in a net charge build-up and consequently a plasma current 11. Whether the charging on the wafer surface 10 is positive or negative depends on a variety of factors such as, for example, the particular plasma gas being used. It is common, however, for plasma charging to be positive since ions are heavier than electrons which therefore tend to be more easily deflected (consequently, the charge 12 on the surface 10 is denoted as positively charged ions).

The wafer surface 10 is often called the "antenna" since it collects the charge 12. The antenna 10 is typically any metallization, conductive layers or interlayer connections that are coupled to a polysilicon gate 14 which overlies a gate oxide layer 16. In addition, the amount of charging on the gate 14 is proportional to the antenna area, consequently a substantial amount of exposed conductive material connected to the polysilicon gate 14 will result in a greater potential for plasma charging damage. The collected charge 12 causes the voltage between the polysilicon gate 14 and a semiconductor substrate 18 to increase. This voltage increase causes current tunneling through the gate oxide 16 (called Fowler-Nordheim tunneling) and into the substrate 18, wherein the current 11 finds a current path back to the plasma to complete the circuit. This tunneling current damages the transistor, degrades its operating characteristics and shortens the useful life of the device.

One proposed solution to plasma charging damage is illustrated in prior art FIGS. 2a–2d and utilizes a reverse-biased protection diode. This prior art solution is briefly discussed in an article entitled *Impact of Plasma Charging Damage and Diode Protection on Scaled Then Oxide*, by Hyungcheol Shin et al., International Electron Devices Meeting, pp. 18.3.1–18.3.4. In prior art FIG. 2a, an NMOS device 20a (needing protection from plasma charging damage) has a gate 22a which is exposed to plasma during device fabrication (often called a plasma gated device). The gate 22a is coupled to a cathode terminal of a protection diode 24a. An anode of the diode 24a is coupled to a circuit ground potential. The reverse bias leakage characteristic of the diode 24a tends to bleed collected charge from the gate 22a to circuit ground through the diode 24a for positive plasma charging. The forward bias conduction of the diode 24a serves to eliminate negative plasma charging of the gate 22a Similarly, a PMOS transistor 20b has a gate 22b protected by a diode 24b which relies on reverse bias leakage to bleed negative plasma charging and forward biased conduction to eliminate any positive plasma charging, as illustrated in prior art FIG. 2b. The reverse bias leakage current and the forward bias diode current is illustrated in greater detail in regions 26 and 28, respectively, of prior art FIG. 2c. FIG. 2c is a graph illustrating the diode current as a function of its bias voltage as is well known by those skilled in the art. FIG. 2d is a fragmentary cross section illustrating a typical manner by which the diode 22a is formed using a p-n junction.

The diode solution of prior art FIGS. 2a and 2b suffers from several drawbacks. As MOS devices such as devices 20a and 20b continue to shrink, the gate oxide further decreases in thickness. Consequently, the maximum allowable plasma charge voltage on the gates 22a and 22b (above which plasma charging damage occurs due to the above-described tunneling phenomena) also decreases. Since the reverse bias leakage current of the diodes 24a and 24b is small and decreases as the reverse bias voltage decreases, its capability of bleeding off the plasma charge while reverse biased is severely limited. Therefore the protection diodes 24a and 24b of FIGS. 2a and 2b can only protect against one type of plasma charging as the diodes 24a and 24b only work to effectively eliminate plasma charging in one-half of its voltage range (i.e., forward biased). It is desirable to provide a sensitive plasma charging protection structure and method which eliminates both positive and negative plasma-induced charging.

SUMMARY OF THE INVENTION

The present invention is directed toward a device and method for providing a low voltage, high current plasma damage protection structure that substantially eliminates both positive and negative plasma charging during processing. The present invention includes a plasma damage protection structure coupled to a gate of a transistor to be protected. The structure conducts positive plasma charging through a first conduction path and negative plasma charging through a second conduction path. Each conduction path is sufficiently conductive to conduct a substantial amount of plasma charge so that plasma induced charging damage during processing is substantially eliminated.

According to another aspect of the present invention, an antenna structure is coupled to a control terminal of the plasma charging damage protection structure to increase the sensitivity of the structure to both positive or negative plasma charging, thereby ensuring conduction of plasma charging through either the first or second conduction paths before the plasma charging can damage the gate oxide of the transistor being protected.

According to yet another aspect of the present invention, a method of preventing plasma induced charging damage by removing plasma charging during semiconductor processing is disclosed. The method includes the formation of plasma charging on a device needing protection during processing. The method then conducts the plasma charging though a first conduction path for positive plasma charging and conducts the plasma charging through a second conduction path for negative plasma charging. Consequently, the method substantially prevents plasma induced charging from damaging the gate oxide of transistors during processing.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a fragmentary, perspective view of a prior art structure on a wafer experiencing the plasma charging damage phenomena;

FIGS. 2a and 2b are schematic diagrams illustrating prior art plasma charging protection structures;

FIG. 2c is a graph illustrating the conduction characteristics of the prior art plasma charging protection structures of FIG. 2a and 2b;

FIG. 2d is a fragmentary cross-section illustrating the prior art plasma charging protection structure of FIG. 2a;

FIG. 3b is a fragmentary cross-section illustrating an exemplary layout of the plasma charging protection structure of FIG. 3a;

DETAILED DESCRIPTION OF THE INVENTION

Figure 3A:
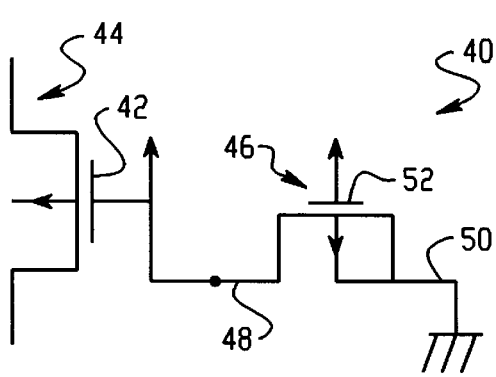
FIG. 3a is a schematic diagram illustrating a plasma charging protection structure in accordance with an embodiment of the present invention.

The present invention will now be described with reference to the drawings wherein like reference numerals are used to refer to like elements throughout. One embodiment of the present invention includes a plasma gated protection structure that couples to a gate terminal of a transistor to be protected. The plasma gated protection structure protects the transistor from both positive and negative plasma charging at the transistor gate by providing a first conduction path for positive plasma charging and a second conduction path for negative plasma charging. The plasma gated protection structure also provides a substantial improvement over prior art protection structures by utilizing an activated MOS transistor configuration for the first conduction path and a forward biased diode configuration for the second conduction path, thereby allowing for substantial amounts of either positive or negative plasma charging to be discharged with a single protection structure. Furthermore, since the protection structure is plasma gated, the protection structure does not interfere with the normal operation of the transistor after processing is completed.

According to another embodiment of the present invention, a charge enhancement structure (e.g., a charge collecting antenna structure) is attached to the plasma gated protection structure and thereby makes the plasma gated protection structure more sensitive to plasma charging at the transistor gate. Consequently, the plasma gated protection structure is more likely to trigger or activate and drain away any plasma charge (either positive or negative) from the transistor gate before the charge reaches a level sufficient to cause damage to the gate oxide of the transistor needing protection.

Referring initially to FIGS. 3a–3e and in particular to FIG. 3a, a plasma gated protection structure 40 is coupled to a gate terminal 42 of a transistor 44 that requires protection during semiconductor processing. The plasma gated protection structure 40 preferably includes a transistor 46 having a source terminal 48 coupled to the gate terminal 42 of the transistor 44, and a drain terminal 50 coupled to a substantially fixed voltage potential (e.g., circuit ground potential). The transistor 46 also has a gate terminal 52 that is floating and is itself exposed or subject to plasma charging during semiconductor processing. The transistor 46 is thus said to be plasma gated since the operation of the transistor 46 will be dictated by the plasma charging that occurs during semiconductor processing. The plasma gated protection structure 46 of FIG. 3a provides two separate conduction paths depending on whether the plasma charging of the gate terminal 42 is positive or negative. The manner in which the two conduction paths preferably operate may best be understood in conjunction with FIGS. 3b–3e.

Figure 3B:
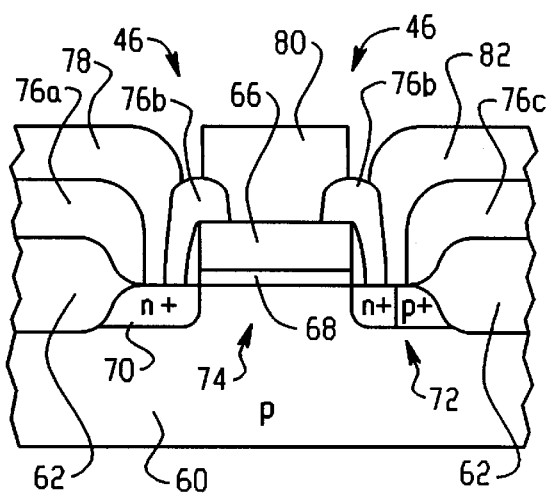
Figure 3C:
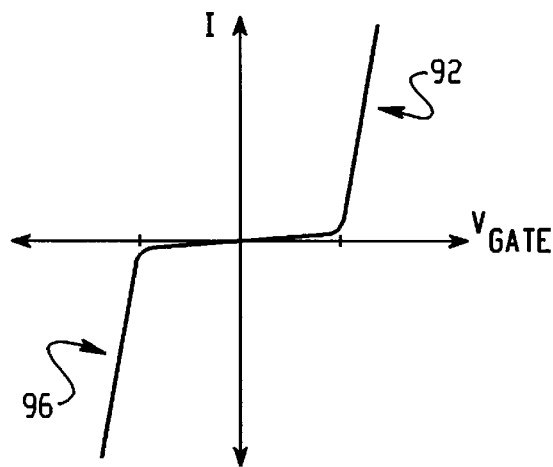
FIG. 3c is a graph illustrating the conduction characteristics of the plasma charging protection structure of FIG. 3a for both positive and negative plasma charging.

FIG. 3b illustrates a preferred cross-section layout of the transistor 46 representing the protection structure 40 of FIG. 3a, although other structural layouts are also contemplated as falling within the scope of the present invention. The transistor 46 is formed in the same substrate 60 as the transistor 44 which needs protection. Therefore the gate 52 of the transistor 46 and the gate 42 of the transistor 44 are exposed to the same plasma during processing and therefore are subject to the same type of plasma charging. The transistor 46 illustrated in FIG. 3b includes a p-type substrate 60 having isolation regions 62 which sandwich the transistor 46 composed of a polysilicon gate 66 (corresponding to a portion of the gate 52 of FIG. 3a) overlying a gate oxide layer 68. An n+-type source region 70 and an n+/p+-type drain region 72 (corresponding to the source 48 and drain 50 of FIG. 3a, respectively) are separated by a channel region 74. Isolation regions 76a, 76b and 76c provide electrical isolation for a source metal 78 (which attaches to the source 48 of the transistor 46 and the gate 42 of the transistor 44 that requires protection), a gate metal 80 (which relates to the gate 52 of FIG. 3a) which is exposed to the plasma during processing, and a drain metal 82 which is coupled to the circuit ground potential. Note that as is typical with NMOS type devices, the substrate 60 is tied low (e.g., ground potential) and in a PMOS type device the substrate 60 will be tied high (e.g., $V_{CC}$).

Figure 3D:
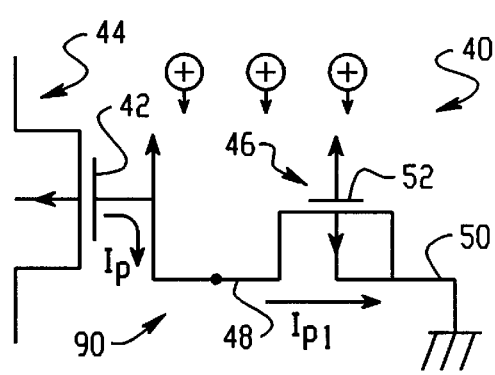
FIG. 3d is a schematic diagram illustrating the plasma charging protection structure of FIG. 3a conducting positive plasma charging through a first conduction path.

When positive plasma charging occurs during semiconductor processing, as illustrated in FIG. 3d, the gate 42 and the gate metal 80 of the transistor 44 and the protection structure 40 are positively charged, respectively. Once the voltage (dictated by the positive plasma charging at the gate metal 80) exceeds a threshold voltage above the drain potential (which is circuit ground potential in this exemplary embodiment) the transistor 46 turns on and drains (conducts) the plasma charge at the gate 42 of the transistor 44 through a first conduction path 90 (also shown as the plasma current $I_{P1}$), as illustrated in FIG. 3d. The first conductive path 90 consists of the charge conducting from the source metal 78 (which is connected to the gate 42 of the transistor 44) into the source region 70, through the channel 74 and drain region 72 and to the circuit ground potential through the drain metal 82. Since the transistor 46 of the protection structure 40 is fully turned on, it has substantial conduction capability, as illustrated by region 92 of FIG. 3c, and can fully discharge all the plasma charging that exists. Consequently, the protection structure 40 protects the transistor 44 from positive plasma charging at its gate 42.

Figure 3E:
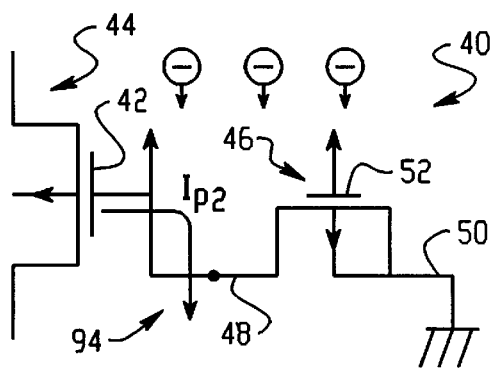
FIG. 3e is a schematic diagram illustrating the plasma charging protection structure of FIG. 3a conducting negative plasma charging through a second conduction path.

In the second case where negative plasma charging occurs, as illustrated in FIG. 3e, the gate 42 and the gate metal 80 of the transistor 44 and the protection structure 40, are negatively charged, respectively. Once the negative voltage at the gate 42 falls below a diode drop of the p-n+ junction formed by the substrate 60 and the source region 70 of the protection structure 40, the electrons will discharge along a second conduction path 94 (also shown as the plasma current $I_{P2}$) from the transistor gate 42 through the source metal 78 and the source region 70 and into the substrate 60, as illustrated in FIG. 3e. Note that in FIG. 3e, the plasma current $I_{P2}$ is illustrated as flowing from the gate 42 of the transistor 44 and into the protection structure 40. This notation, however, does not follow the conventional current flow notation as flowing in the opposite direction of electron movement. The plasma current $I_{P2}$ of FIG. 3e, however, is illustrated in the opposite direction to better illustrate the conduction path that the negatively charged electrons at the gate 42 will take. Since the diode formed by the substrate 60 and the source region 70 p-n junction (see, e.g., FIG. 3b) is forward biased during the negative plasma charging conduction, the protection structure 40 can fully discharge all the plasma charging that exists, as illustrated in region 96 of FIG. 3c.

As can be seen from the above discussion, the protection structure 40 of the present invention is capable of discharging substantially all positive and negative plasma charging. Since the structure utilizes an activated transistor structure for the first conduction path 90 and a forward biased diode structure for the second conduction path 94, the protection structure 40 is capable of discharging substantially all of the positive or negative plasma charging regardless of the effective antenna size coupled to the transistor gate 42. Consequently, the protection structure 40 of the present invention overcomes the deficiencies of the prior art.

Figure 4:
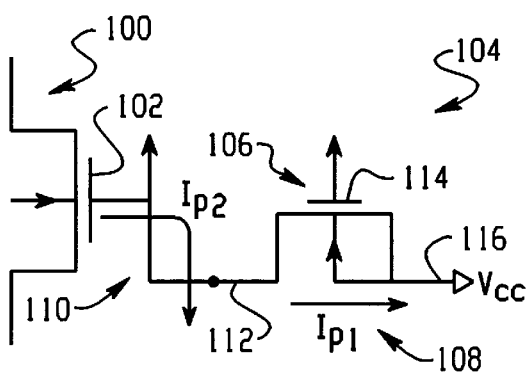
FIG. 4 is a schematic diagram illustrating a plasma charging protection structure in accordance with another embodiment of the present invention.

Although the embodiment of FIGS. 3a–3e protects an NMOS transistor (transistor 44) from plasma charging damage, the present invention is equally applicable to the protection of PMOS transistors such as the PMOS transistor 100 illustrated in FIG. 4. The PMOS transistor 100 has a gate 102 that requires protection from plasma charging damage. A protection structure 104, preferably including a PMOS protection transistor 106, is coupled to the gate 102 and conducts negative plasma charging through a first conduction path 108 ($I_{P1}$) and positive plasma charging through a second conduction path 110 ($I_{P2}$), respectively.

The PMOS protection structure has a source terminal 112 coupled to the gate 102 of the transistor, a gate terminal 114 exposed to the plasma (plasma gated) and a drain terminal 116 coupled to a substantially fixed voltage potential (e.g., $V_{CC}$). When the transistor 100 experiences negative charging during plasma processing the gate terminal 114 of the protection structure 104 also accumulates negative charge. When the gate terminal 114 falls a threshold voltage ($V_T$) below $V_{CC}$, the transistor 106 turns on (see region 92 of FIG. 3c) and the transistor 106 conducts the negative plasma charge away from the gate 102 through the first conduction path 108 ($I_{P1}$). Note that the actual current flow will be in the opposite direction, however, $I_{P1}$ is drawn as shown to illustrate the direction of charge movement.

When the transistor 100 experiences positive charging at the gate terminal 102, a diode formed by a p+-n junction between the source terminal 112 and the substrate (not shown) will become forward biased (see, e.g., region 96 of FIG. 3c) and the positive plasma charge will be removed from the gate 102 through the second conduction path 110 ($I_{P2}$). Consequently, the protection structure 104 is capable of substantially eliminating both positive and negative plasma charging on PMOS type transistors by conducting the plasma charge through one of two highly conductive conduction paths, thereby overcoming the limitations of the prior art.

Figure 5A:
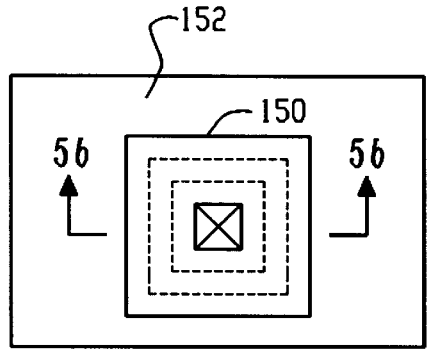
FIG. 5a is a plan view of a block charge collector antenna according to another embodiment of the present invention.

In accordance with another embodiment of the present invention, a plan view of a charge collecting antenna 150 for increasing the sensitivity of the protection structures 40 and 104 (of FIGS. 3a and 4, respectively) is illustrated in FIG. 5a. The antenna 150 is a block antenna that couples to the gate (either the gate 52 of FIG. 3a or the gate 114 of FIG. 4) to provide plasma charging enhancement. Recall that plasma charging is a function of the size of the antenna coupled to the gate (usually consisting of connecting metallization and/or multilayer interconnects). Consequently, by attaching a plasma charging enhancement structure such as the block antenna 150 of FIG. 5a, one can amplify the plasma charging at the gate of the protection structure (such as, e.g., structures 40 or 104) and thereby ensure that the protection structures initiate the conduction of plasma charging away from the transistor needing protection (such as, e.g., transistors 44 or 100) before any plasma charging damage may occur.

As illustrated by the dotted lines in FIG. 5a, the block antenna structure 150 may vary in size to customize the sensitivity of the plasma charging protection structures. For example, if it is known that a particular transistor is particularly susceptible to plasma charging damage (e.g., has an extraordinarily thin gate oxide) one can make the block antenna 150 larger to ensure that the protection structure triggers before plasma charging damage can occur.

Figure 5B:
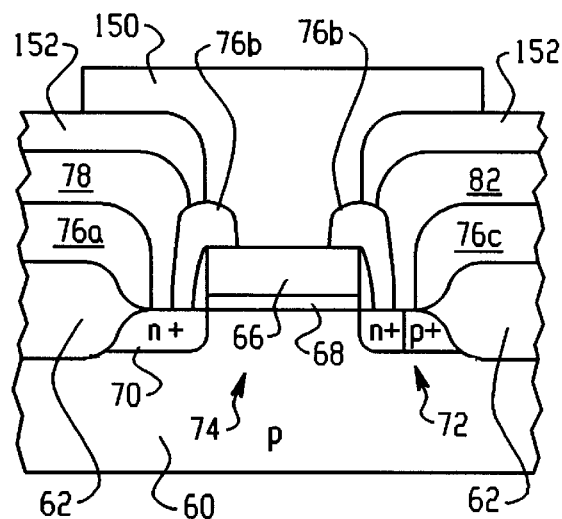
FIG. 5b is a fragmentary cross-section illustrating the block charge collector antenna structure of FIG. 5a coupled to the plasma charging protection structure of FIG. 3b.

FIG. 5b is a fragmentary cross section taken along line 5b—5b of FIG. 5a. FIG. 5b illustrates the protection structure 40, according to one exemplary embodiment, as an NMOS transistor 46 similar to the structure shown in FIG. 3b. FIG. 5b differs from FIG. 3b since the block antenna 150 replaces the gate metal 80 and is electrically isolated from the source metal 78 and drain metal 82 by a passivation layer 152. Since the block antenna 150 overlies the passivation layer 152, one can adjust the size of the antenna 150 to customize the sensitivity of the protection structure by increasing or decreasing the plasma charging enhancement.

Figure 5C:
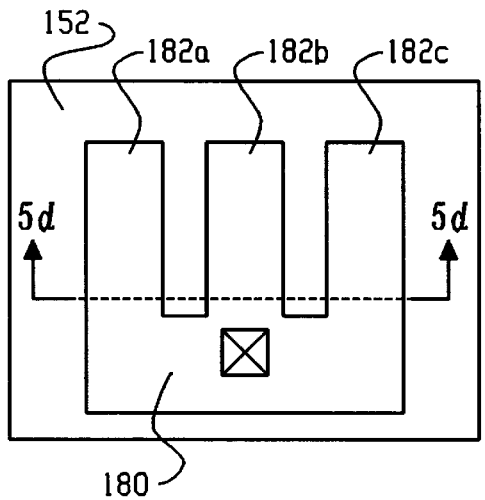
FIG. 5c is a plan view of an electron shading charge collector antenna according to yet another embodiment of the present invention.

In still another embodiment of the present invention, a high sensitivity charge enhancement structure 180 occupying potentially less area than the block antenna 150 is illustrated in FIG. 5c. The structure 180 constitutes a comb-like antenna having a plurality of densely spaced fingers 182a—182c. Although FIG. 5c illustrates only three fingers, it should be understood that any arrangement of two or more fingers are contemplated as falling within the scope of the present invention.

Figure 5D:
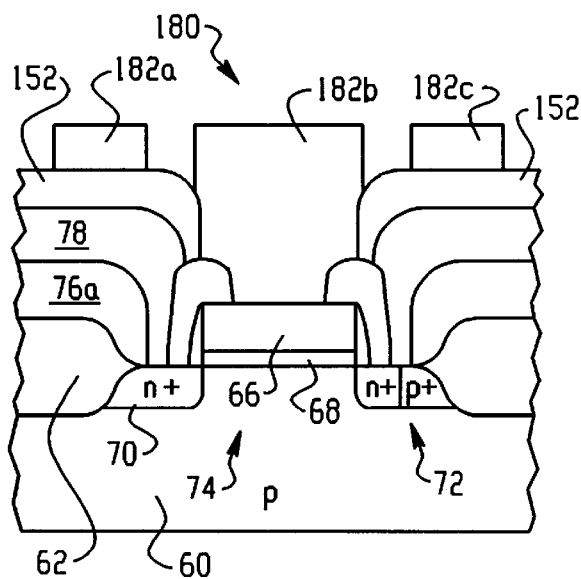
FIG. 5d is a fragmentary cross-section illustrating the electron shading charge collector antenna of FIG. 5c coupled to the plasma charging protection structure of FIG. 3b.

FIG. 5d is a fragmentary cross-section taken along line 5d—5d of FIG. 5c. FIG. 5d illustrates the protection structure 40, according to one exemplary embodiment, as an NMOS transistor 46 similar to the structure shown in FIG. 3b. FIG. 5b differs from FIG. 3b (or FIG. 5b) since the comb-like antenna 180 replaces the gate metal 80 or the block antenna 150. Since the antenna 180 overlies the passivation layer 152, one can alter the overall size of the antenna 180, the aspect ratio of each finger 182a–182c or the spacing between the fingers to customize the charge enhancement capacity of the antenna 180 as desired.

Figure 6:
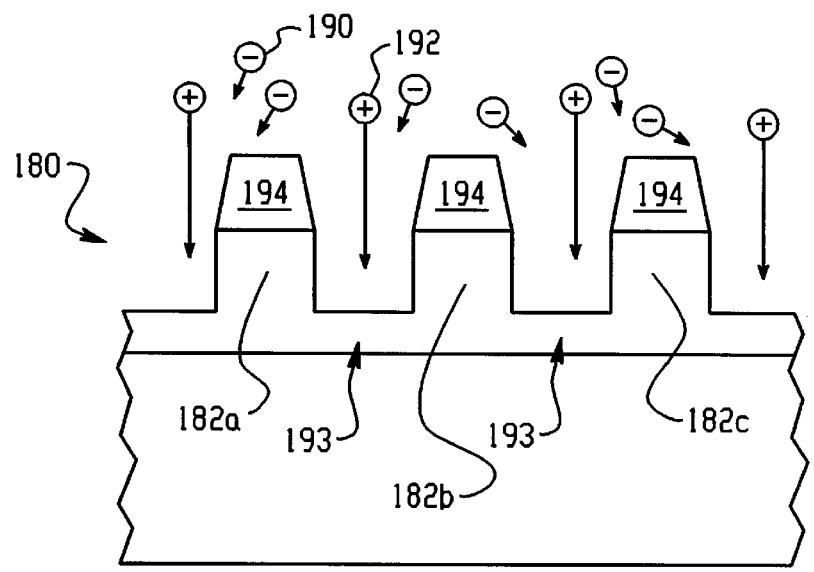
FIG. 6 is a fragmentary cross-section illustrating the electron shading phenomena during etching of an antenna.

The comb-like configuration of the antenna 180 of FIG. 5c is advantageous because it substantially amplifies the plasma charge per unit area of the antenna 180 over the block antenna 150 of FIG. 5a. The amplified charge enhancement therefore provides improved plasma charging sensitivity without sacrificing a substantial amount of area which is an important factor in semiconductor processing. The amplified charge enhancement of the antenna 180 is attributable to the electron shading effect which will be described below in conjunction with FIG. 6.

As the antenna 180 is being plasma etched, negatively charged electrons 190 and positively charged ions 192 impinge onto the metal 193 which remains between the lines (which delineate the fingers 182a–182c). The fingers 182a–182c are not etched away due to the presence of a protective photoresist 194 which serves as an etch mask. It is believed that, as illustrated, the electrons 190 have large angles of incidence (as compared to the ions 192) and therefore the resist mask 194 "shades" the metal 193 from the electrons 190, thereby causing an excessive positive plasma charging after etching is completed. Because the electrons 190 are shaded by the mask 194, less recombination with the positively charged ions 192 occurs, thereby leaving an amplified positive plasma charge per unit area as compared with the block antenna 150 of FIG. 5a.

Although the charge enhancement structures of FIGS. 5a–5d were illustrated in conjunction with an NMOS type protection structure, it should be understood that the present invention contemplates its application with a PMOS-type protection structure or any other type of multiple conduction path protection structure. In addition, although the antenna was described with respect to a block type or comb-like antenna structure, any variation of the charge enhancement structure is contemplated as falling within the scope of the present invention. For example, the charge enhancement structure may be a ring-type structure to take into account inductive effects.

Figure 7:
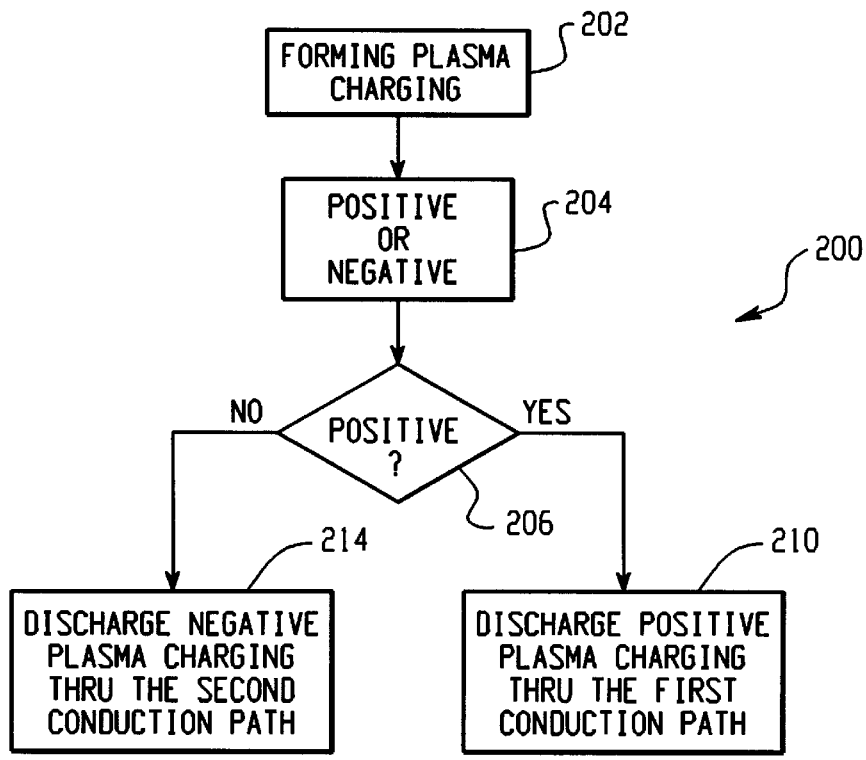
FIG. 7 is a flow chart diagram illustrating steps employed in a method of eliminating positive and negative plasma charging according to still another embodiment of the invention.

Furthermore, although the present invention has been disclosed in conjunction with protection structures, the present invention may be more broadly characterized as a method 200 of preventing plasma induced charging damage, as illustrated in FIG. 7. The discussion of the method 200 will be described in the context of the protection structure 40 of FIG. 3a, however, it should be understood that the method 200 may be employed with any type of appropriate protection structure, circuits or system.

The method 200 of FIG. 7 begins at step 202, wherein the plasma charging occurs during semiconductor processing and its presence is sensed. In this exemplary embodiment, the protection structure 40 is plasma gated so that the existence of any plasma charging is experienced or sensed by the protection structure 40. Step 202 may also include high sensitivity plasma charging sensing capability by incorporating charge enhancement structures such as a block antenna 150 or the electron shading antenna 180 disclosed in FIGS. 5a and 5c, respectively.

The plasma charging once sensed is then identified as being either positive or negative type plasma charging at step 204. This identification step 204 is carried out in the protection structure 40 of FIG. 3a in the manner by which the structure 40 eventually conducts. Once the identification is made, differing protection strategies are employed depending on whether the plasma charging is positive or negative at step 206.

If the plasma charging is determined to be positive (a "YES" at step 206), a first conduction path is activated and the plasma charging is discharged through the activated first conduction path at step 210. In the example of the protection structure 40 of FIG. 3a, the structure 40 has a first conduction path defined by an NMOS transistor in its on-state that discharges the positive plasma charging to ground. If, however, the plasma charging is determined to be negative (a "NO" at step 206), a second conduction path is activated and the plasma charging is discharged through the second conduction path at step 214. Again, in the example of the protection structure 40 of FIG. 3a, the structure 40 has a second conduction path defined by a forward biased diode that discharges the negative plasma charging to $V_{CC}$. Alternatively, however, separate structures or circuits may be employed to address the different types of plasma charging and uniquely discharge it, respectively.

Please note that in the illustrated embodiments above, the protection structures 40 and 104 were plasma gated to provide the sensing of the plasma charging. It should be understood, however, that alternative arrangements may include exposing other device terminals to the plasma to activate the structure to discharge the plasma charging. Any arrangement by which a protection structure is exposed to the plasma charging and uses the charging to activate the structure and discharge the plasma charging through two separate conduction paths based on whether the plasma charging is positive or negative is contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A plasma charging damage protection structure, comprising:

a first conduction path for conducting positive plasma charging away from a device needing protection;

a second conduction path for conducting negative plasma charging away from the device needing protection; and a plasma charging enhancement structure coupled to the protection structure, wherein the enhancement structure increases the sensitivity of the protection structure and aids in conducting the plasma charging away from the device needing protection before the plasma charging causes plasma charging damage, wherein the plasma charging enhancement structure comprises an antenna.

2. The plasma charging damage protection structure of claim 1, wherein the antenna comprises a comb-like antenna having a plurality of fingers.

3. A plasma charging damage protection circuit, comprising:

a transistor needing protection having a gate terminal that is susceptible to plasma charging damage during processing;

a protection structure coupled to the gate terminal of the transistor, wherein the protection structure senses plasma charging and conducts positive plasma charging away from the gate terminal through a first conduction path and conducts negative plasma charging away from the terminal through a second conduction path, wherein the transistor needing protection comprises an NMOS transistor and the protection structure comprises an NMOS transistor protection structure having a source terminal coupled to the gate terminal of the transistor needing protection, a drain terminal coupled to a substantially fixed voltage potential, and a gate terminal that is exposed to a plasma during processing, thereby making the gate terminal plasma gated; and a plasma charging enhancement structure coupled to the gate terminal of the NMOS transistor protection structure, thereby increasing a sensitivity of the NMOS transistor protection structure to the plasma charging.

4. The plasma charging damage protection circuit of claim 3, wherein the plasma charging enhancement structure comprises an antenna.

5. The plasma charging damage protection circuit of claim 4, wherein the antenna comprises a comb-like antenna having a plurality of fingers.

6. A plasma charging damage protection circuit, comprising:

a transistor needing protection having a gate terminal that is susceptible to plasma charging damage during processing;

a protection structure coupled to the gate terminal of the transistor, wherein the protection structure senses plasma charging and conducts positive plasma charging away from the gate terminal through a first conduction path and conducts negative plasma charging away from the terminal through a second conduction path.

wherein the transistor needing protection comprises a PMOS transistor and the protection structure comprises a PMOS transistor protection structure having a source terminal coupled to the gate terminal of the transistor needing protection, a drain terminal coupled to a substantially fixed voltage potential, and a gate terminal that is exposed to a plasma during processing, thereby making the gate terminal plasma gated, and a plasma charging enhancement structure coupled to the gate terminal of the PMOS transistor protection structure, thereby increasing a sensitivity of the PMOS transistor protection structure to the plasma charging.

7. The plasma charging damage protection circuit of claim 6, wherein the plasma charging enhancement structure comprises an antenna.

8. The plasma charging damage protection circuit of claim 7, wherein the antenna comprises a comb-like antenna having a plurality of fingers.

* * * * *

UNITED STATES PATENT AND TRADEMARK OFFICE
CERTIFICATE OF CORRECTION

PATENT NO.: 5,963,412

DATED: October 5, 1999

INVENTOR(S): William George En

It is certified that error appears in the above-identified patent and that said Letters Patent is hereby corrected as shown below:

Column 3, Line 23, please replace the word "though" with the word --through--.

Signed and Sealed this

Ninth Day of May, 2000

*Attest:*

Q. TODD DICKINSON

*Attesting Officer*    *Director of Patents and Trademarks*